(12) United States Patent
Chen et al.

(10) Patent No.: US 11,804,708 B2
(45) Date of Patent: Oct. 31, 2023

(54) FAST TRIGGERING ELECTROSTATIC DISCHARGE PROTECTION

(71) Applicant: NVIDIA Corp., Santa Clara, CA (US)

(72) Inventors: Jauwen Chen, Cupertino, CA (US);
Sunitha Venkataraman, San Jose, CA (US); Ting Ku, San Jose, CA (US)

(73) Assignee: NVIDIA CORP., Santa Clara, CA (US)

( * ) Notice: Subject to any disclaimer, the term of this patent is extended or adjusted under 35 U.S.C. 154(b) by 10 days.

(21) Appl. No.: 16/812,048

(22) Filed: Mar. 6, 2020

(65) Prior Publication Data
US 2021/0281067 A1 Sep. 9, 2021

(51) Int. Cl.
*H02H 9/04* (2006.01)
*H01L 27/02* (2006.01)

(52) U.S. Cl.
CPC ......... *H02H 9/046* (2013.01); *H01L 27/0255* (2013.01); *H01L 27/0277* (2013.01); *H01L 27/0281* (2013.01)

(58) Field of Classification Search
CPC . H02H 9/046; H01L 27/0255; H01L 27/0277; H01L 27/0281
USPC .......................................................... 361/56
See application file for complete search history.

(56) References Cited

U.S. PATENT DOCUMENTS

| | | | |
|---|---|---|---|
| 4,829,350 A * | 5/1989 | Miller | H01L 27/0266 257/357 |
| 7,304,827 B2 * | 12/2007 | Chen | H01L 27/0285 361/56 |
| 7,907,374 B2 * | 3/2011 | Huang | H02H 9/046 361/56 |
| 9,172,244 B1 * | 10/2015 | Ma | H01L 21/8234 |
| 2002/0122280 A1 * | 9/2002 | Ker | H01L 27/0262 257/E29.225 |
| 2004/0218322 A1 * | 11/2004 | Chen | H01L 27/0285 361/56 |
| 2010/0265622 A1 * | 10/2010 | Campi, Jr. | H01L 27/0274 257/360 |

OTHER PUBLICATIONS

Ming-Dou Ker, Wen-Yi Chen, Wuu-Trong Shieh, and I-Ju Wei, New Layout Scheme to Improve ESD Robustness of I/O Buffers in Fully-Silicided CMOS Process, EOS/ESD Symposium 09 (Year: 2009).*
Yuan 2007, CMOS Current-Mode Circuits for Data Communications, Springer US, Boston, MA, 243-267 (Year: 2007).*
Lin et. al, "Diode Isolation Concept for Low Voltage and High Voltage Protection Applications", 1-58537-175-0 ESDA, 2009.
Mergens et. al, "High Holding Current SCRs (HHI-SCR) for ESD Protection and Latch-up Immune IC Operation", 1-58537-040-1/2002 ESDA, 2002.
A Thoughtful Approach to Field-Service Grounding, ESD Journal, Mar. 1989.

* cited by examiner

*Primary Examiner* — Thienvu V Tran
*Assistant Examiner* — Sreeya Sreevatsa
(74) *Attorney, Agent, or Firm* — Rowan TELS LLC

(57) ABSTRACT

An electrostatic discharge protection circuit is disclosed. It comprises a stacked drain-ballasted NMOS devices structure and a gate bias circuit. The gate bias circuit includes an inverter, a first gate bias output terminal, and a second gate bias output terminal. The first gate bias output terminal is coupled to a gate of a first one of the drain-ballasted NMOS devices. The second gate bias output terminal runs from an output of the inverter to a gate of a second one of the drain-ballasted NMOS devices.

6 Claims, 6 Drawing Sheets

FAST TRIGGERING ELECTROSTATIC DISCHARGE PROTECTION

BACKGROUND

In the world of electronic devices and in particular integrated circuits, electrostatic discharge (ESD) is a significant problem. "Electrostatic discharge" refers to the flow of current through a circuit, induced by a difference in potential between the circuit and an object that touches or comes into proximity with the circuit. The difference in potential is often a result of electrostatic buildup or depletion on the object. Circuits and components in close proximity to I/O pads of a device tend to be particularly vulnerable to electrostatic discharge. The heat generated by electrostatic discharge can cause metal conductors and junctions to open, cause electric shorts, cause oxide rupture, or other serious damage to circuit components. Susceptibility to electrostatic discharge increases with the shrinking size of electronic process fabrication technology, and components directly connected to the input-output (IO) pads are particularly vulnerable.

For these reasons electrostatic discharge protection is often included in modern integrated circuit devices. Such protection is typically disposed in parallel with the circuitry to be protected so that potentially harmful transient currents caused by electrostatic discharge events can be safely shunted away. Such protection is sometimes referred to as electrostatic discharge "clamps".

N-type metal-oxide semiconductor field effect transistors (MOSFETs) (commonly referred to as NMOSs or NFETs) are commonly used for electrostatic discharge protection. Typically, the drain of the NMOS is connected to the pad and the gate (usually grounded) is coupled to the source. As depicted in the I-V characteristic plot 100 of FIG. 1, as the drain voltage rises during an ESD transient, reverse bias current increases in the reverse bias current ramp 102 region until the trigger voltage $V_t$ of the parasitic bipolar transistor (comprised of the drain, body and source) is reached. "Trigger voltage" refers to the induced electrostatic discharge voltage that triggers activation of an electrostatic discharge protection circuit. At the trigger voltage, avalanche occurs and the I-V characteristic plot 100 enters "snapback" in the snapback region 104. "Snapback" refers to a characteristic, temporary, and intermediate decrease in the current ramp behavior of an NMOS device in response to increasing applied voltage. Without some provision for providing current conduction uniformity, the current increases virtually unchecked until burn-out of the device occurs in the burnout region 106. However, if conduction uniformity is provided, a safe current limit at high ESD voltages is maintained in the uniform conduction region 108 and the ESD current is safely shunted away from the IC circuitry.

Prior solutions are disadvantaged by requiring a trigger voltage and triggering time for the electrostatic discharge protection circuit that may provide inadequate protection, and may suffer from non-uniform triggering of the snapback device (double snapback behavior). This makes such prior solutions sensitive to process variations and results in random human body model and charge device model failures.

"Charge device model" refers to a model for characterizing the susceptibility of an electronic device or circuit to damage from electrostatic discharge in which the device or circuit is exposed to a discharge at a particular voltage level, and then tested for survival. If it withstands this voltage level, it is tested at the next level and so on, until the device fails. The charge device model is technically specified in ANSI/ESDA/JEDEC joint standard JS-002. "Human body model" refers to model for characterizing the susceptibility of an electronic device or circuit to damage from electrostatic discharge. The model is a simulation of the discharge which might occur when a human touches an electronic device. One such test model is defined in the United States military specification, MIL-STD-883, Method 3015.9, electrostatic discharge Sensitivity Classification. An internationally widely used specification is JEDEC standard JS-001. A similar specification, IEC 61000-4-2, is used for system level testing and quantifies protection levels for a real world ESD event in an uncontrolled environment.

Other prior solutions are based on grounded-gate stacked NMOS devices that utilize gate modulation or substrate pumping to ensure uniform triggering of the electrostatic discharge circuit. Additionally, some prior solutions utilize a series diode with stacked NMOS devices to implement a silicon controlled rectifier, but at the cost of high trigger voltage and holding voltage that may lead to human body model and charge device model failures. "Silicon controlled rectifier" refers to a gate controlled, one-way current regulating solid state device comprising at least four layers of alternating n- and p-type material.

Other prior solutions utilize a P+/Nwell diode disposed proximate to an NMOS device or drain-ballasted NMOS device to improve the failure current level of an ESD protection circuit. However the trigger voltage of such a solution is still high enough that damage to the protected circuit can occur, and even approaches the drain breakdown voltage of the NMOS device.

BRIEF SUMMARY

This disclosure relates to an electrostatic discharge protection circuit. The electrostatic discharge protection circuit may comprise a stacked drain-ballasted NMOS devices structure and a gate bias circuit. The gate bias circuit may include an inverter, a first gate bias output terminal, and a second gate bias output terminal. The first gate bias output terminal may be coupled to a gate of a first one of the drain-ballasted NMOS devices. The second gate bias output terminal may run from an output of the inverter to a gate of a second one of the drain-ballasted NMOS devices.

This disclosure also relates to an electrostatic discharge protection circuit for an IO pad. The electrostatic discharge protection circuit for an IO pad may comprise a P+/Nwell diode and stacked drain-ballasted NMOS devices structure forming a silicon controlled rectifier, and a gate bias circuit. The gate bias circuit may comprise an inverter, a first gate bias output terminal, and a second gate bias output terminal. The first gate bias output terminal may be coupled via a series of diodes to the IO pad and to a gate of a first one of the drain-ballasted NMOS devices. The second gate bias output terminal may run from an output of the inverter to a gate of a second one of the drain-ballasted NMOS devices.

Finally, this disclosure relates to an electronic device comprising at least one IO pad and an electrostatic discharge protection circuit coupled between at least one IO pad and internal circuitry. The electrostatic discharge protection circuit may comprise a plurality of drain-ballasted NMOS devices arranged in series between the IO pad and a ground and a gate bias circuit. The gate bias circuit may comprise a series of diodes disposed between the IO pad and a gate of a first one of the drain-ballasted NMOS devices. The gate bias circuit may further comprise an inverter disposed between an internal power rail of the electronic device and a gate of a second one of the drain-ballasted NMOS devices.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
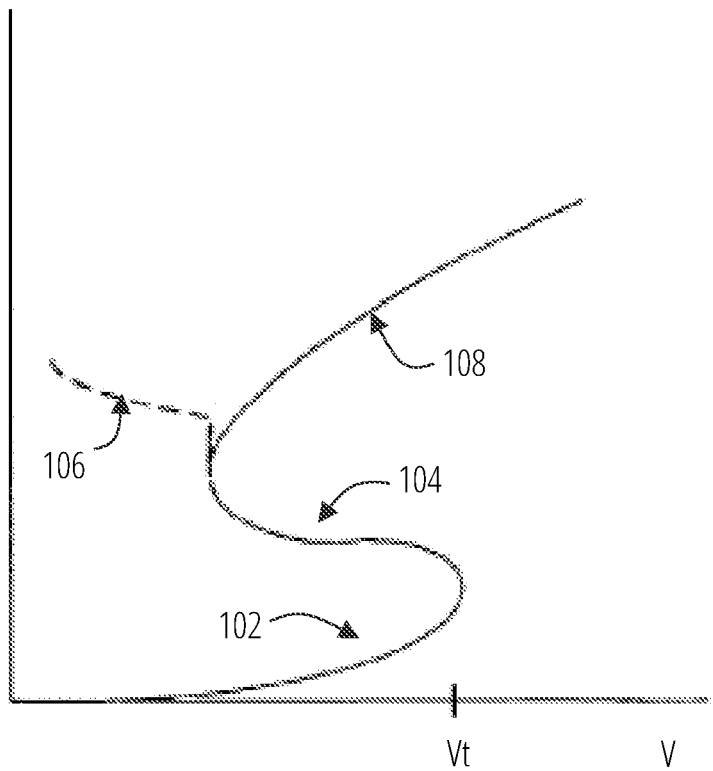
FIG. 1 depicts a MOSFET I-V characteristic plot 100 in accordance with one embodiment.

The following description involves certain terms which should be understood as follows. "Output terminal" refers to an electrical coupling for signals generated by a circuit or device. Likewise an input terminal is an electrical coupling for signals applied into a circuit or device. "Inverter" refers to a circuit that generates the inverse of the potential applied at its input terminal at its output terminal. "IO pad" refers to an input or output terminal of a device or circuit, typically a conductive pin accessible from a package or enclosure of the device or circuit. "Ground" refers to an electrical ground reference in a device or circuit, such as a ground plane. The ground need not be Earth ground and may have some non-zero reference potential during operation. "Internal power rail" refers to a terminal, plane, or other conductor providing the output potential from a device power source.

"Gate bias circuit" refers to a circuit for generating a bias voltage on the gate region of a transistor. The bias voltage (depending on polarity) may be used to decrease or increase the time and/or voltage to turn on (or turn off) the transistor. "Drain-ballasted NMOS device" refers to a technique for providing conduction uniformity in multi-fingered NMOS devices. A ballasting resistance is added in the drain region of the NMOS. For example ballasting may be achieved by extending the spacing between drain contacts and the gate with a salicide block. Insertion of the block causes the resistivity of the N+ diffusion or implant region to increase. To keep contact resistance low and ohmic, the drain contacts may be directly coupled to the salicided diffusion region. Ballasting resistance serves several functions. First, it allows uniform snap-back triggering on the section or fingers of the NMOS. Without a ballast resistance, one section may trigger ahead of others and become destroyed before other sections turn on. Ballast resistance raises the failure voltage of a section to the point where other sections can trigger before the first triggering section fails. Second, current and heat build-up in channel regions reaching the critical temperature is limited. The critical temperature is the temperature at which the intrinsic carrier concentration or thermal generated carrier concentration exceeds the background carrier concentration. "P+/Nwell diode" refers to a diode device formed with a p-doped well inside an n-doped well.

The following description relates to embodiments of fast triggering, low leakage electrostatic discharge (ESD) protection circuits. The circuits may be disposed in parallel with IO pads of devices that work with external signals ranging up to 3.3V and which operate internally at 1.8V voltage levels. The circuit may be utilized with devices employing FinFET technology to ensuring safe operating gate voltages during JO pin operation. "FinFET" refers to a multi-gate MOSFET (metal-oxide-semiconductor field-effect transistor) built on a substrate where the gates are placed on two, three, or four sides of the channel or wrapped around the channel, forming a multi-gate gate structure.

The disclosed embodiments utilize drain-ballasted NMOS devices and a series diode to the IO pad terminal. The series diode reduces JO pin leakage during normal operation. "Normal" operation is operation in the absence of electrostatic discharge events.

Figure 2:
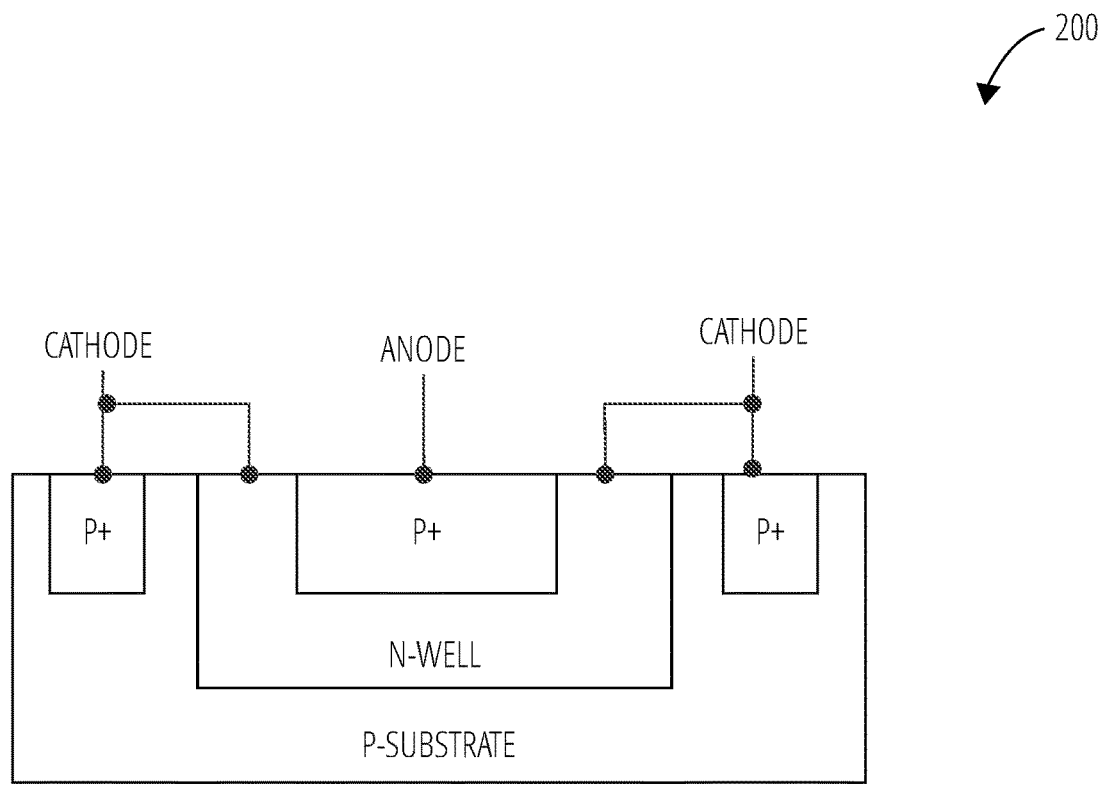
FIG. 2 depicts a P+/Nwell diode 200 in accordance with one embodiment.

In one embodiment the series diode is a P+/Nwell diode interleaved with two stacked drain-ballasted NMOS devices to create a PNPN silicon controlled rectifier structure. A schematic for a P+/Nwell diode 200 is depicted in FIG. 2.

A gate bias circuit is also disclosed for use with ESD protection circuits. The gate bias circuit biases the gates of the stacked drain-ballasted NMOS devices to enable a reduced trigger voltage and/or trigger current than is needed in conventional approaches, especially during charge device model (CDM) ESD events, while ensuring proper gate biasing during normal IO pin operation. "Trigger current" refers to the induced electrostatic discharge current that triggers activation of an electrostatic discharge protection circuit.

Relative to prior solutions, the disclosed solutions achieve a lower trigger voltage and/or trigger current than conventional approaches, a higher or comparable failure (protection circuit breakdown) current, and lower or comparable JO pin leakage during normal operation. In one embodiment the failure current in the CDM (~1 ns) time frame is improved from >6.6 mA/um to >12 mA/um, and the trigger voltage is reduced from 5V to 2V.

Figure 3:
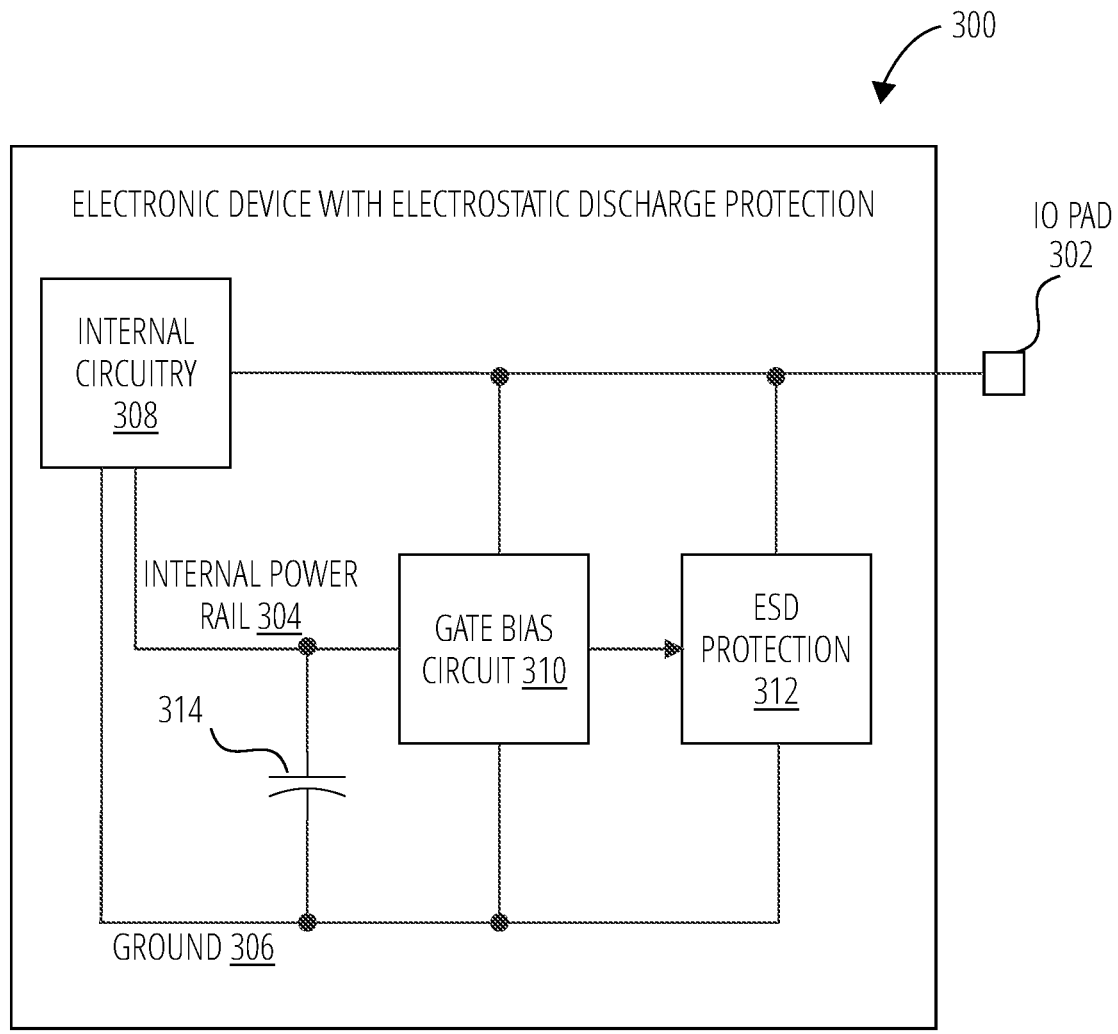
FIG. 3 depicts an electronic device 300 in accordance with one embodiment.

FIG. 3 depicts an electronic device 300 in one embodiment, comprising, at a high level, an IO pad 302, an internal power rail 304, a ground 306, internal circuitry 308, a gate bias circuit 310, and electrostatic discharge protection 312.

In the depicted embodiment the high-level components are coupled as follows. The IO pad 302, the internal power rail 304, and the ground 306 are electrically coupled to the internal circuitry 308. The IO pad 302 provides an electronic input and/or output signal connection to a device, circuit, or system external to the electronic device 300. The internal power rail 304 provides the power the electronic device 300 utilizes to operate. The ground 306 provides a return path that allows current to flow from the IO pad 302 and internal power rail 304 in order for electrical signaling to be accomplished. The ground 306 is a reference potential and need not be at actual Earth ground potential.

The IO pad 302, internal power rail 304, and ground 306 are additionally electrically coupled to a gate bias circuit 310. A voltage differential between the internal power rail 304 and the signaling level on the IO pad 302 allows the gate bias circuit 310 to either enable or disable the electrostatic discharge protection 312 as needed. This is described in further detail with regard to FIG. 4.

Referring again to FIG. 3, the IO pad 302, internal power rail 304, and ground 306 are further electrically coupled to an electrostatic discharge protection 312 circuit. The gate bias circuit 310 activates the electrostatic discharge protection 312 circuit when an ESD event is detected. The gate bias circuit 310 becomes enabled during an ESD event to enable ESD current to flow from the IO pad 302 directly to ground 306, without flowing into and thereby potentially damaging the internal circuitry 308.

The internal power rail 304 and ground 306 are connected to either side of a decoupling capacitor 314 to provide a path to ground for noise on the internal power rail 304. A decoupling capacitor 314 may act as a high pass filter, maintaining electrical separation for low frequency signals but shunting high frequency signals such as electrical noise to ground. Thus the decoupling capacitor 314 may adequately isolate power from ground 306 while preventing the spread of noise and interference across a system by way of the internal power rail 304.

Figure 4:
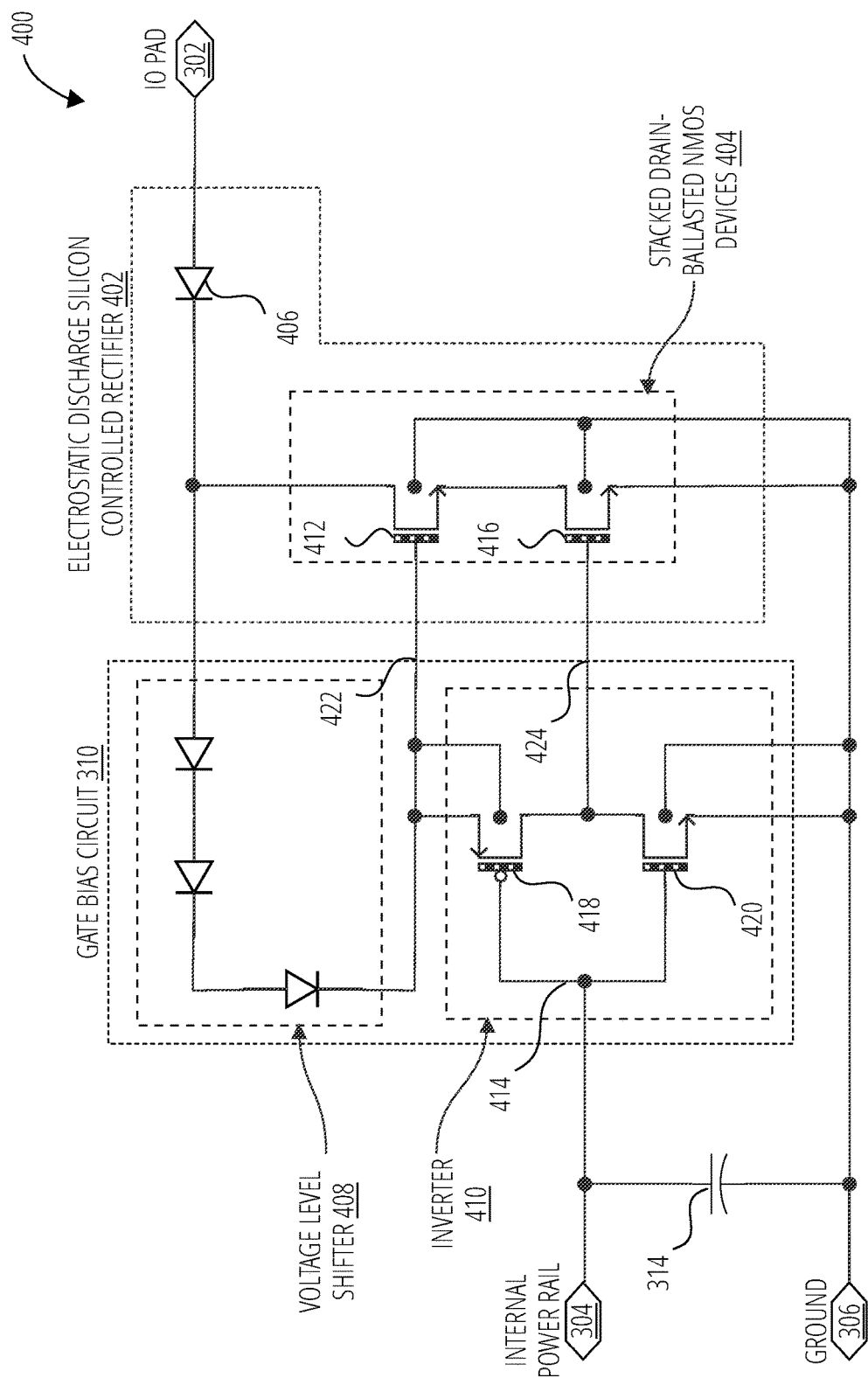
FIG. 4 depicts an electrostatic discharge protection circuit 400 in accordance with one embodiment.

FIG. 4 depicts an electrostatic discharge protection circuit 400 in one embodiment. At a high level, the electrostatic discharge protection circuit 400 comprises an electrostatic discharge silicon controlled rectifier 402 enabled by a gate bias circuit 310. In the depicted embodiment, the high-level components are coupled as follows. The electrostatic discharge silicon controlled rectifier 402 (ESD SCR) is coupled to the IO pad 302 to protect internal circuitry from the high voltages that may be incurred during an ESD event. The electrostatic discharge silicon controlled rectifier 402 is also coupled to ground 306 to provide a path to ground for current incurred as a result of an ESD event. The electrostatic discharge silicon controlled rectifier 402 may be directly coupled to a first gate bias output terminal 422 and a second gate bias output terminal 424, such that the gate bias circuit 310 may operate the electrostatic discharge silicon controlled rectifier 402 as an open circuit (within a tolerance) during normal operation and as a path from the IO pad 302 to ground 306 in the event of an ESD event. "Directly coupled" refers to a direct electrical connection without intervening electrical components, or a resistive electrical connection in which the intervening electrical components have a substantially (within a tolerance of the implementation) linear resistive nature (e.g., not including diodes, transistors, capacitors etc.)

The gate bias circuit 310 is coupled to the electrostatic discharge silicon controlled rectifier 402 by way of a first gate bias output terminal 422 and second gate bias output terminal 424 in order to enable operation of the electrostatic discharge silicon controlled rectifier 402 during an electrostatic discharge event.

The gate bias circuit 310 comprises a voltage level shifter 408 or voltage level changer and an inverter 410. The voltage level shifter 408, here comprised of a series of diodes, is coupled to the IO pad 302. The series of diodes in the depicted embodiment shifts the signal expressed on the IO pad 302 down in voltage incrementally across each diode. In this manner, the IO pad 302 may accept signaling levels that exceed the internal levels driven by the internal power rail 304. For example, the IO pad 302 may accept 3.3V signaling levels, while the internal power rail runs at 1.8V. The diodes of the voltage level shifter 408 may thus provide some overvoltage protection during normal operation. The output of the voltage level shifter 408 supplies an inverter 410.

The inverter 410 of the gate bias circuit 310 may comprise a PMOS device 418 and an NMOS device 420. The voltage level shifter 408 output may connect to the source side of the PMOS device 418, such that the level-shifted IO pad 302 signal acts as power for the inverter 410 circuit. The inverter input terminal 414 is coupled to the internal power rail 304 which acts as the input to the inverter 410 circuit. The source side of the NMOS device 420 is coupled to ground 306. The drain sides of the PMOS device 418 and NMOS device 420 may be joined together at the second gate bias output terminal 424 which is the output terminal of the inverter 410. The inverter 410 output signal thus operates as the second gate bias output terminal 424 to the stacked drain-ballasted NMOS devices 404 of the electrostatic discharge silicon controlled rectifier 402. As described later in conjunction with FIG. 6, the inverter may in some embodiments be coupled to invert, at the second gate bias output terminal, a composite of the signal from the internal power rail and a signal from the IO pad.

The electrostatic discharge silicon controlled rectifier 402 may comprise a P+/Nwell diode 406 and stacked drain-ballasted NMOS devices 404. The stacked drain-ballasted NMOS devices 404 (first NMOS device 412 and a second NMOS device 416) may in some cases comprise gate-coupled devices, such as one or more grounded-gate NMOS devices. In another example the gate of the first NMOS device 412 may be coupled to a power rail, and the second NMOS device 416 is a grounded-gate NMOS device. "Grounded-gate NMOS device" refers to an NMOS device in which the gate and body are coupled together to ground. The drain of a grounded-gate NMOS may be connected to an I/O pad to protect from electrostatic discharge. A parasitic NPN bipolar junction transistor (BJT) is thus formed with the drain (n-type) acting as the collector, the source (n-type) as the emitter, and the substrate (p-type) as the base. A parasitic resistance is present between the emitter and base terminals of the parasitic NPN BJT. This resistance is a result of the finite conductivity of the p-type doped substrate. When an ESD event occurs at the I/O pad (drain), the collector-base junction of the parasitic NPN BJT becomes reverse biased to the point of avalanche breakdown. At this point, the positive current flowing from the base to ground induces a voltage potential across the parasitic substrate resistor, causing a positive voltage to appear across the base-emitter (BE) junction. This voltage forward biases the BE junction, triggering the parasitic NPN BJT. The P+/Nwell diode 406 may be directly coupled to the IO pad 302 and may form the anode end of the silicon controlled rectifier. The source of the second NMOS device 416 may be directly coupled to ground 306, and may form the cathode of the silicon controlled rectifier.

To reduce the trigger voltage of the stacked NMOS devices, a gate bias circuit is applied to bias the gates of the stacked NMOS devices during an ESD event. The gate of the first NMOS device 412 may be directly coupled to the first gate bias output terminal 422 (i.e., the output terminal of the voltage level shifter 408). The gate of the second NMOS device 416 may be directly coupled to the second gate bias output terminal 424 (i.e., the output terminal of the inverter 410). Thus the stacked drain-ballasted NMOS devices 404 may be enabled by the gate bias circuit 310 during an ESD event. When enabled, the first NMOS device 412 and second NMOS device 416 of the stacked drain-ballasted NMOS devices 404 may provide a quick path to ground for ESD current. This process is described in further detail with respect to FIG. 5.

Figure 5:
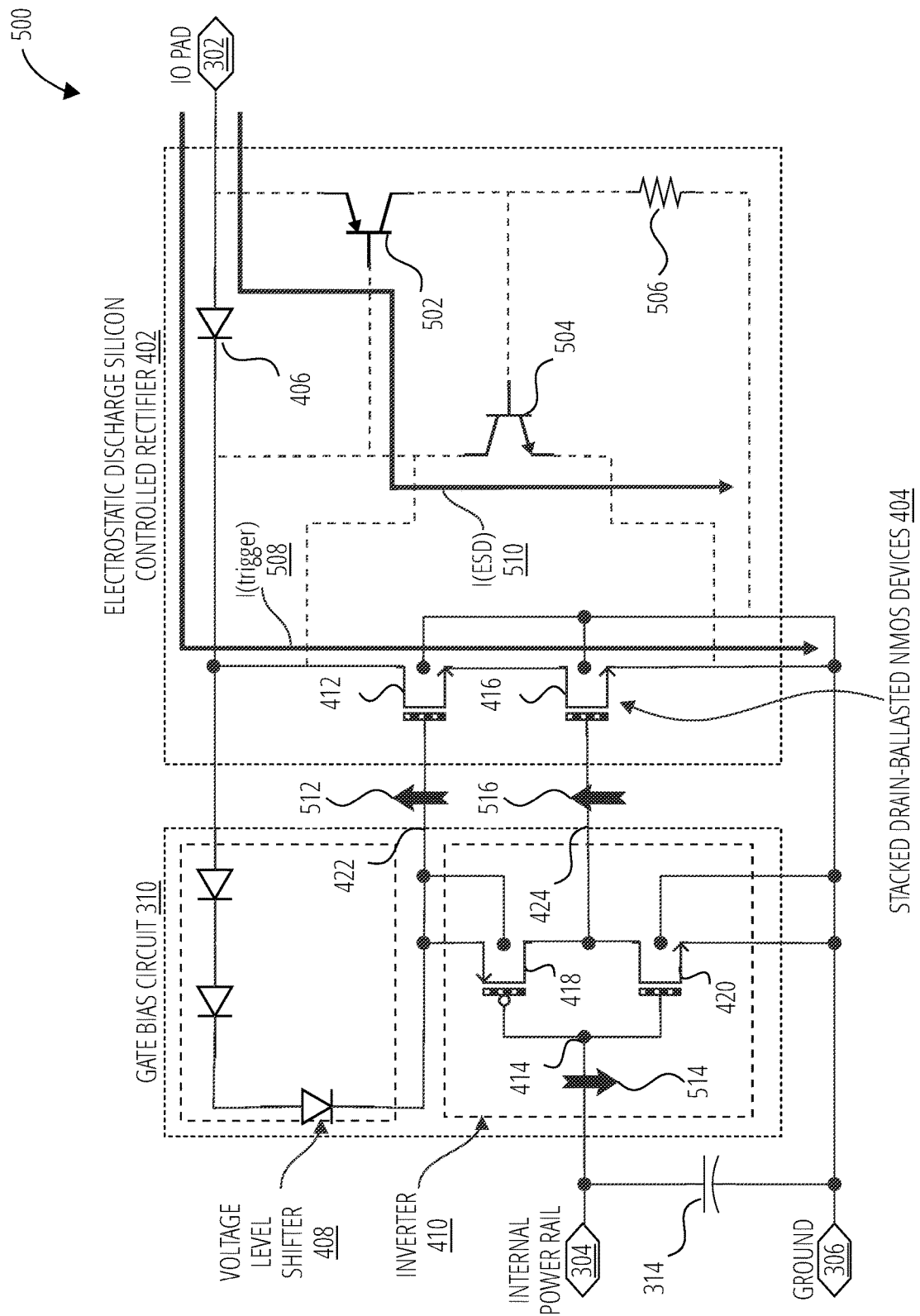
FIG. 5 depicts a response to electrostatic discharge 500 by the electrostatic discharge protection circuit 400 in accordance with one embodiment.

FIG. 5 depicts a response to electrostatic discharge 500 by the electrostatic discharge protection circuit 400 in accordance with one embodiment. During an ESD event, the interaction of the electrostatic discharge silicon controlled rectifier 402 is modeled by the connections shown as dashed lines and the components PNPBJT 502, NPNBJT 504, and substrate resistance 506.

During normal operation internal power rail 304 provides an internal supply voltage level to the various circuit components, such as 1.8 V. In this case, the NMOS device 420 of the inverter 410 is turned ON, and pulls the gate of the second NMOS device 416 to ground 306, thus forming a grounded-gate NMOS device. Until the voltage on the IO pad 302 reaches a threshold level (as determined in part by the voltage level shifter 408), such as 3.63 V, the gate of the first NMOS device 412 may be at a normal operating level (e.g., nominally 2.0 V). This maintains the gate-to-drain voltage of the first NMOS device 412 and the gate-to-source voltage of the second NMOS device 416 below a threshold activation level (e.g., 1.98 V). Thus, during normal operation, the stacked drain-ballasted NMOS devices 404 of the electrostatic discharge silicon controlled rectifier 402 is not conducting current and acts as an open (very high impedance) circuit.

During an ESD event on the IO pad 302, the IO pad 302 voltage increases rapidly. This causes the output of the diode string of the voltage level shifter 408 to increase rapidly at the first gate bias output terminal 422, pulling up the voltage at the gate of the first NMOS device 412 as indicated by the arrow 512. The inverter input terminal 414 is pulled down due to the decoupling capacitor 314 as indicated by the arrow 514. This turns the PMOS device 418 ON. As a result, the second gate bias output terminal 424 is pulled up as indicated by arrow 516, causing the gate voltage of the second NMOS device 416 to follow the gate voltage of the first NMOS device 412. This enables the trigger current 508 to flow through the P+/Nwell diode 406 and the stacked drain-ballasted NMOS devices 404. Thus triggered, the electrostatic discharge silicon controlled rectifier 402 provides the main pathway to sink the current induced by the ESD event to ground 306.

The initial trigger current 508 flowing to ground 306 through the electrostatic discharge silicon controlled rectifier 402 is a channel current in the stacked drain-ballasted NMOS devices 404 that seeds avalanche breakdown. That is, the gate-to-source voltages across the stacked drain-ballasted NMOS devices 404 increases and their drain breakdown voltage decreases. This trigger current 508 lead to increased substrate current flow. PNPBJT 502 represents the parasitic PNP transistor characteristics formed by the P+/NWell of the P+/Nwell diode 406, with the third terminal being the P-substrate. Trigger current 508 flowing through PNPBJT 502 induces a substrate current that elevates the local substrate potential and induces the parasitic transistor NPN characteristics represented by NPNBJT 504 formed by the drain of the first NMOS device 412, the P-substrate, and the source of the second NMOS device 416. Once NPNBJT 504 activates, the SCR triggers, causing the ESD current 510 to flow through the SCR from IO the pad 302 to ground 306. The substrate resistance 506 models the resistance of the substrate between the IO pad 302 and ground 306, as experienced by the ESD current 510 flow resulting from an ESD voltage.

Thus, the stacked drain-ballasted NMOS devices 404 provides a path to ground 306 that is highly responsive to current incurred as an ESD event initiates. Through the parasitic transistor and resistor characteristics inherent in the electrostatic discharge silicon controlled rectifier 402, the initial current flow, in the form of a trigger current 508, may trigger a response which facilitates the even faster flow of ESD current 510 to ground 306.

Figure 6:
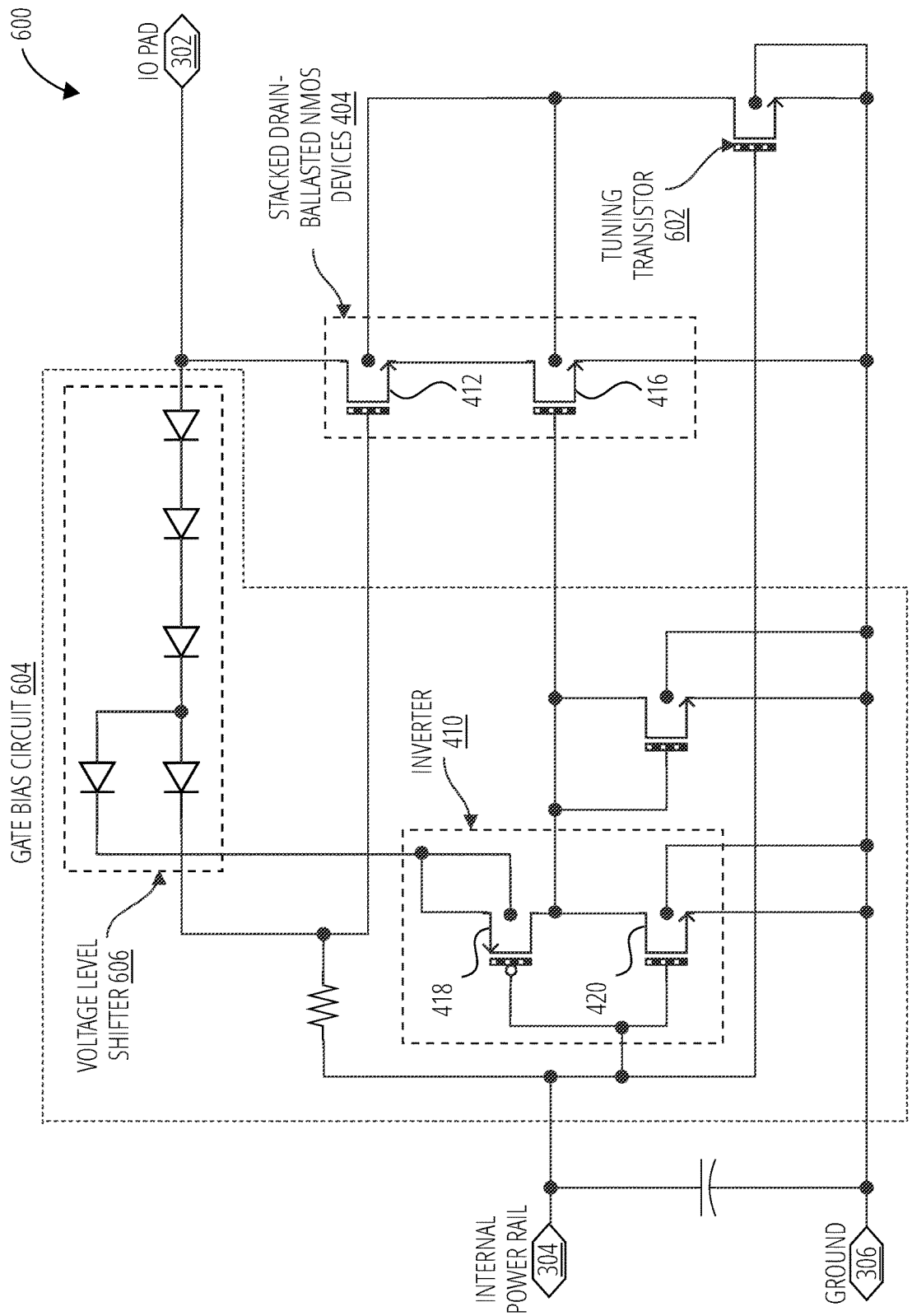
FIG. 6 depicts an electrostatic discharge protection circuit 600 in accordance with another embodiment.

FIG. 6 depicts an electrostatic discharge protection circuit 600 in another embodiment. In common with the electrostatic discharge protection circuit 400 embodiment depicted in FIG. 4, the electrostatic discharge protection circuit 600 comprises a stacked drain-ballasted NMOS devices 404, an IO pad 302, an internal power rail 304, a ground 306, and an inverter 410. The electrostatic discharge protection circuit 600 further comprises a tuning transistor 602 (which may also be used in the electrostatic discharge protection circuit 400 embodiment), a voltage level shifter 606 comprising a series of diodes, and a modified gate bias circuit 604.

The tuning transistor 602 may provide a configurable ground 306 connection for the P-substrate of the stacked drain-ballasted NMOS devices 404. The alternate gate bias circuit 604 illustrated may be used to trigger the stacked drain-ballasted NMOS devices 404 using a composite of the signal from the internal power rail 304 and the signal from the IO pad 302. This configuration may reduce the trigger voltage of the stacked drain-ballasted NMOS devices 404 during an ESD event. This configuration may also ensure that the trigger voltage of a snapback ESD NMOS device is reduced, and the internal circuitry 308 is better protected during a charge device model (CDM) or human body model (HBM) event.

Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. An electrostatic discharge protection circuit for an IO pad, the electrostatic discharge protection circuit comprising:
   a connection between the IO pad and a circuit ground, the connection consisting of a stacked drain-ballasted NMOS devices structure;
   wherein a channel of each of the NMOS devices is coupled to a channel of a tuning transistor, the channel of the tuning transistor being directly connected to the circuit ground;
   a gate bias circuit comprising:
      an inverter directly connected to a power supply rail at its inverting input terminal;
      a first gate bias output terminal coupled via a series of diodes to the IO pad and to a gate of a first one of the drain-ballasted NMOS devices; and
      a second gate bias output terminal from an output of the inverter to a gate of a second one of the drain-ballasted NMOS devices.

2. The electrostatic discharge protection circuit of claim 1, wherein the inverter comprises:
   an NMOS device;
   a PMOS device; and
   a drain of the NMOS device coupled to a drain of the PMOS device at a node, the node forming the second gate bias output terminal.

3. The electrostatic discharge protection circuit of claim 2, wherein a substrate of the PMOS device is coupled to the series of diodes and a substrate of the NMOS device is directly connected to the circuit ground.

4. The electrostatic discharge protection circuit of claim 2, wherein both of a gate of the PMOS device and a gate of the NMOS device are directly connected via an inverting input terminal of the inverter to the power supply rail.

5. The electrostatic discharge protection circuit of claim 1, wherein the series of diodes form a voltage level changer between the TO pad and the first gate bias output terminal.

6. The electrostatic discharge protection circuit of claim 1, wherein the inverter is coupled to invert, at the second gate bias output terminal, a composite of a signal from the power supply rail and a signal from the IO pad.

* * * * *